United States Patent
Chen et al.

(10) Patent No.: US 8,233,578 B2
(45) Date of Patent: *Jul. 31, 2012

(54) PHASE-INTERPOLATOR BASED PLL FREQUENCY SYNTHESIZER

(75) Inventors: Chun-Ying Chen, Irvine, CA (US); Michael Q. Le, Irvine, CA (US); Myles Wakayama, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 459 days.

This patent is subject to a terminal disclaimer.

(21) Appl. No.: 11/649,809

(22) Filed: Jan. 5, 2007

(65) Prior Publication Data
US 2007/0110207 A1    May 17, 2007

Related U.S. Application Data

(63) Continuation of application No. 10/284,341, filed on Oct. 31, 2002, now Pat. No. 7,162,002, which is a continuation-in-part of application No. 10/131,033, filed on Apr. 25, 2002, now Pat. No. 7,379,520, which is a continuation-in-part of application No. 10/131,034, filed on Apr. 25, 2002, now Pat. No. 6,922,109.

(60) Provisional application No. 60/360,175, filed on Mar. 1, 2002, provisional application No. 60/368,557, filed on Apr. 1, 2002.

(51) Int. Cl.
*H03D 3/24* (2006.01)
(52) U.S. Cl. ........ 375/376; 375/354; 375/316; 327/147; 327/156; 342/103
(58) Field of Classification Search .................. 375/376, 375/362, 373, 374, 375, 354, 316; 455/260; 327/147, 156; 342/103
See application file for complete search history.

(56) References Cited

U.S. PATENT DOCUMENTS 4,424,486 A    1/1984 Denton et al.
(Continued)

FOREIGN PATENT DOCUMENTS

EP    0 909 035 A2    4/1999
(Continued)

OTHER PUBLICATIONS

Larsson, *A 2-1600-MHz CMOS Clock Recovery PLL With Low-Vdd Capability*, IEEE Journal of Solid-State Circuits, vol. 34, No. 12, Dec. 1999, pp. 1951-1960.
(Continued)

*Primary Examiner* — Chieh M Fan
*Assistant Examiner* — Leila Malek
(74) *Attorney, Agent, or Firm* — Sterne, Kessler, Goldstein & Fox P.L.L.C.

(57) ABSTRACT

A phase lock loop frequency synthesizer includes a phase rotator in the feedback path of the PLL. The PLL includes a phase detector, a low pass filter, a charge pump, a voltage controlled oscillator ("VCO"), and a feedback path connecting output of the VCO to the phase detector. The feedback path includes a phase rotator connected to the output of the VCO and to an input of a frequency divider. Coarse frequency control is implemented by adjusting the input reference frequency to the phase detector or by adjusting the divider ratio of the frequency divider. Fine frequency control is achieved by increasing or decreasing the rotation speed of the phase rotator. The phase rotator constantly rotates phase of the VCO output, thereby causing a frequency shift at the output of the phase rotator.

6 Claims, 8 Drawing Sheets

U.S. PATENT DOCUMENTS

| | | | |
|---|---|---|---|
| 4,816,775 A | | 3/1989 | Ryan |
| 5,485,490 A | | 1/1996 | Leung et al. |
| 5,570,066 A | * | 10/1996 | Eberhardt et al. ............... 331/34 |
| 5,920,216 A | | 7/1999 | Fischer |
| 6,002,279 A | | 12/1999 | Evans et al. |
| 6,114,914 A | * | 9/2000 | Mar ................................ 331/16 |
| 6,122,336 A | | 9/2000 | Anderson |
| 6,310,498 B1 | | 10/2001 | Larsson |
| 6,363,124 B1 | | 3/2002 | Cochran |
| 6,397,042 B1 | | 5/2002 | Prentice et al. |
| 6,473,470 B1 | | 10/2002 | Matui |
| 6,509,773 B2 | | 1/2003 | Buchwald et al. |
| 6,570,946 B1 | | 5/2003 | Homol et al. |
| 6,901,126 B1 | * | 5/2005 | Gu ................................ 375/355 |
| 6,922,109 B2 | * | 7/2005 | Fallahi et al. ..................... 331/2 |
| 2001/0006544 A1 | | 7/2001 | Kawasaki et al. |
| 2002/0021153 A1 | | 2/2002 | Saeki |
| 2003/0123594 A1 | * | 7/2003 | Glenn et al. .................. 375/373 |
| 2003/0185327 A1 | | 10/2003 | Chen |

FOREIGN PATENT DOCUMENTS

| | | |
|---|---|---|
| WO | WO 00/46949 | 8/2000 |
| WO | WO 01/84702 A2 | 11/2001 |
| WO | WO 01/84702 A3 | 11/2001 |

OTHER PUBLICATIONS

European Search Report for Appl. No. EP 03 00 4684, issued May 19, 2003, 4 pages.

* cited by examiner

FIG. 7

| LEVEL | 0° DAC 1 | DAC 2 | DAC 3 | DAC 4 | 90° DAC 5 | DAC 6 | DAC 7 | DAC 8 | 180° DAC 9 | DAC 10 | DAC 11 | DAC 12 | 270° DAC 13 | DAC 14 | DAC 15 | DAC 16 |
|---|---|---|---|---|---|---|---|---|---|---|---|---|---|---|---|---|
| 0  | 1 | 1 | 1 | 1 | 0 | 0 | 0 | 0 | 0 | 0 | 0 | 0 | 0 | 0 | 0 | 0 |
| 1  | 0 | 1 | 1 | 1 | 1 | 0 | 0 | 0 | 0 | 0 | 0 | 0 | 0 | 0 | 0 | 0 |
| 2  | 0 | 0 | 1 | 1 | 1 | 1 | 0 | 0 | 0 | 0 | 0 | 0 | 0 | 0 | 0 | 0 |
| 3  | 0 | 0 | 0 | 1 | 1 | 1 | 1 | 0 | 0 | 0 | 0 | 0 | 0 | 0 | 0 | 0 |
| 4  | 0 | 0 | 0 | 0 | 1 | 1 | 1 | 1 | 0 | 0 | 0 | 0 | 0 | 0 | 0 | 0 |
| 5  | 0 | 0 | 0 | 0 | 0 | 1 | 1 | 1 | 1 | 0 | 0 | 0 | 0 | 0 | 0 | 0 |
| 6  | 0 | 0 | 0 | 0 | 0 | 0 | 1 | 1 | 1 | 1 | 0 | 0 | 0 | 0 | 0 | 0 |
| 7  | 0 | 0 | 0 | 0 | 0 | 0 | 0 | 1 | 1 | 1 | 1 | 0 | 0 | 0 | 0 | 0 |
| 8  | 0 | 0 | 0 | 0 | 0 | 0 | 0 | 0 | 1 | 1 | 1 | 1 | 0 | 0 | 0 | 0 |
| 9  | 0 | 0 | 0 | 0 | 0 | 0 | 0 | 0 | 0 | 1 | 1 | 1 | 1 | 0 | 0 | 0 |
| 10 | 0 | 0 | 0 | 0 | 0 | 0 | 0 | 0 | 0 | 0 | 1 | 1 | 1 | 1 | 0 | 0 |
| 11 | 0 | 0 | 0 | 0 | 0 | 0 | 0 | 0 | 0 | 0 | 0 | 1 | 1 | 1 | 1 | 0 |
| 12 | 0 | 0 | 0 | 0 | 0 | 0 | 0 | 0 | 0 | 0 | 0 | 0 | 1 | 1 | 1 | 1 |
| 13 | 1 | 0 | 0 | 0 | 0 | 0 | 0 | 0 | 0 | 0 | 0 | 0 | 0 | 1 | 1 | 1 |
| 14 | 1 | 1 | 0 | 0 | 0 | 0 | 0 | 0 | 0 | 0 | 0 | 0 | 0 | 0 | 1 | 1 |
| 15 | 1 | 1 | 1 | 0 | 0 | 0 | 0 | 0 | 0 | 0 | 0 | 0 | 0 | 0 | 0 | 1 |

FIG. 8

| LEVEL | 1 DAC | 2 DAC | 3 DAC | 4 DAC | 5 DAC | 6 DAC | 7 DAC | 8 DAC | 9 DAC | 10 DAC | 11 DAC | 12 DAC | 13 DAC | 14 DAC | 15 DAC | 16 DAC |
|---|---|---|---|---|---|---|---|---|---|---|---|---|---|---|---|---|
| | | | | 0° | | | 90° | | | 180° | | | 270° | | | |
| k | 0 | 0 | 0 | 0 | 0 | 0 | 1 | 1 | 1 | 1 | 0 | 0 | 0 | 0 | 0 | 0 |
| k+1 | 0 | 0 | 0 | 0 | 0 | 0 | 1 | 1 | 1 | 1 | 1 | 0 | 0 | 0 | 0 | 0 |
| k+2 | 0 | 0 | 0 | 0 | 0 | 0 | 0 | 1 | 1 | 1 | 1 | 0 | 0 | 0 | 0 | 0 |

PHASE-INTERPOLATOR BASED PLL FREQUENCY SYNTHESIZER

CROSS-REFERENCE TO RELATED APPLICATIONS

This application is a continuation of U.S. patent application Ser. No. 10/284,341, filed Oct. 31, 2002, which claims priority to U.S. Provisional Patent Application No. 60/360, 175, filed Mar. 1, 2002, which is incorporated by reference herein in its entirety;

This application is a continuation-in-part of U.S. patent application Ser. No. 10/131,033, filed Apr. 25,2002, which claims priority to U.S. Provisional Patent Application No. 60/368,557, filed Apr. 1, 2002, whereby both applications are incorporated by reference herein in their entireties; and This application is a continuation-in-part of U.S. patent application Ser. No. 10/131,034, filed Apr. 25, 2002, which claims priority to U.S. Provisional Application No. 60/368, 557, filed Apr. 1, 2002, whereby both applications are incorporated by reference herein in their entireties.

BACKGROUND OF THE INVENTION

1. Field of the Invention

The present invention is related to a phase lock loop ("PLL") frequency synthesizer. More specifically, the present invention is related to a PLL frequency synthesizer having a phase rotator inside the PLL loop to provide fine frequency control.

2. Background Art

Conventional systems use frequency synthesizers to generate new clock frequency based on a reference frequency clock. Some examples of such frequency synthesizers are Fractional-N type phase lock loop ("PLL") circuit or Direct Digital Frequency Synthesizer ("DDFS") type PLL. These systems have several disadvantages. For instance, Fractional-N type PLL systems have complicated digital modulation scheme and poor spur noise. On the other hand, DDFS type PLL systems require a read-only memory ("ROM") table and a digital-to-analog converter ("DAC"), which consume a lot of power and circuit area. Therefore, there is a need for a better frequency synthesizer with improved PLL architecture that is capable of reducing jitter in the system without compromising power and/or circuit area.

BRIEF SUMMARY OF THE INVENTION

The present invention is related to systems and methods for fine frequency control within a phase lock loop ("PLL") circuit. More specifically, the present invention is related to a phase lock loop frequency synthesizer having a phase rotator placed in a feedback path of the PLL to implement fine frequency control.

The phase lock loop includes a phase detector, a low pass filter, a charge pump, a voltage controlled oscillator ("VCO") and a feed back path connecting output of the VCO to one of the input terminals of the phase detector. The feedback path includes a phase rotator connected to the output of the VCO and to an input of a frequency divider in the feedback path. The divider connects the phase rotator to one of the input terminals of the phase detector.

Coarse frequency control is implemented by adjusting the divider ratio of the frequency divider. In another embodiment, coarse frequency control can be implemented by adjusting input reference frequency to the phase detector. Fine frequency control is achieved by adjusting the rotation speed of the phase rotator.

For fine frequency control, the phase rotator adjusts VCO output frequency by constantly rotating phase of the VCO output. The speed of rotation of the phase rotator determines whether the VCO frequency is adjusted up or down. By constantly rotating phases of the VCO output, the phase rotator changes VCO frequency because frequency is a derivative of phase. More specifically, phase rotator rotates the phase of the VCO output according to an input clock, and the fine frequency control is implemented by increasing or decreasing the frequency of the input clock. The phase rotator enables frequency synthesis with a good resolution and a low noise.

The speed of rotation of the phase rotator is controlled by an accumulator and a digital frequency control word. The digital frequency control word (or a programmable step) activates the accumulator to change phase rotator's speed of rotation.

Any high frequency noise generated by the phase rotator is rejected by the PLL by properly setting the loop bandwidth of the PLL. Therefore, a low noise synthesized output from the VCO is generated.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 7 is a table showing sequences representing phases generated by a 4-bit phase rotator.

FIG. 8 is a table showing sequences representing phases generated by a modified 4-bit phase rotator, according to embodiments of the present invention.

The present invention is described with reference to the accompanying drawings. In the drawings, like reference numbers indicate identical or functionally similar elements.

Figure 1:
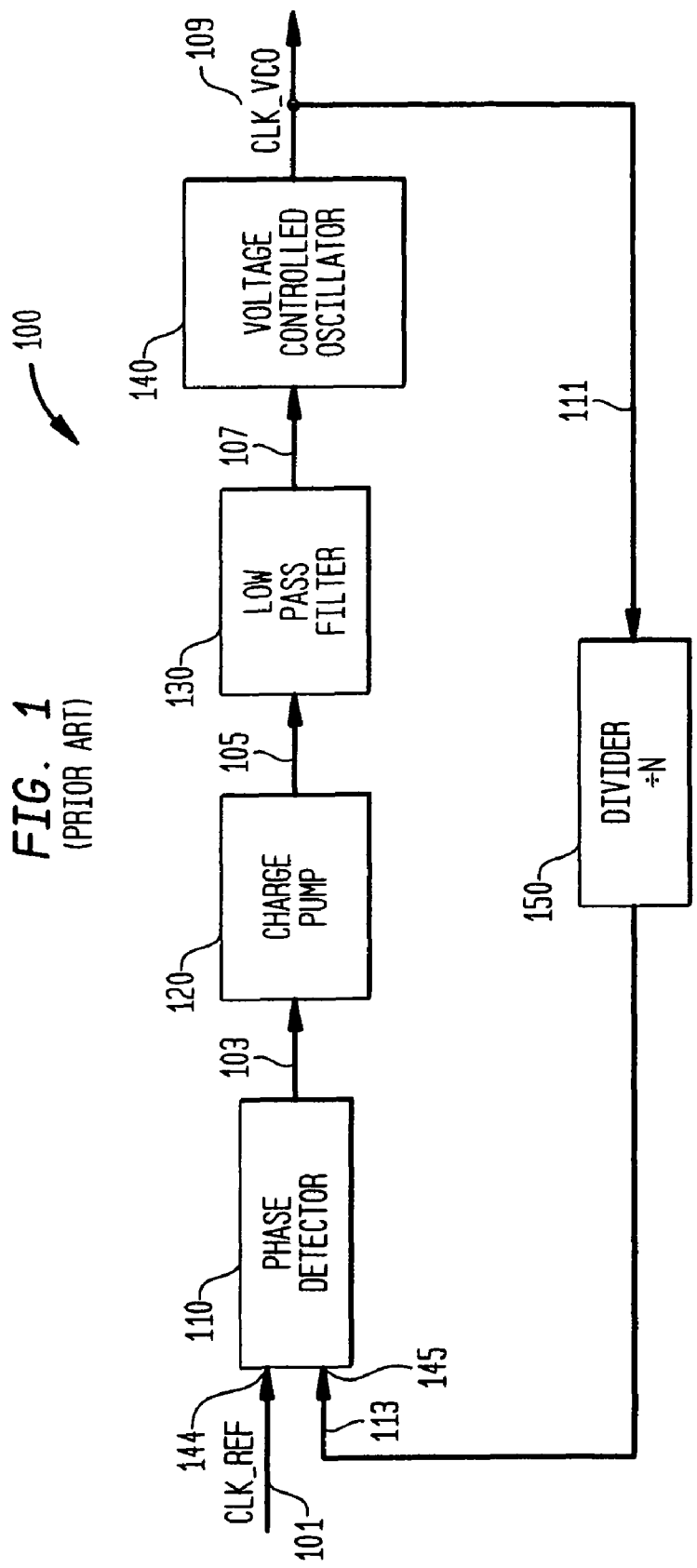
FIG. 1 illustrates a conventional phase lock loop circuit.

Additionally, the leftmost digit of a reference number identifies the drawing in which the reference number first appears.

DETAILED DESCRIPTION OF THE INVENTION

Table of Contents.

1. Overview
2. Phase Lock Loop Circuit
3. Frequency Synthesizer Circuit with Phase Rotator
4. Phase Rotator
5. Low Jitter Phase Rotator
6. Conclusion

1. OVERVIEW

The present invention relates to systems and methods for output phase and frequency tuning of a frequency synthesizer having a phase lock loop ("PLL"). The present invention is capable of generating a new frequency based on a reference clock frequency supplied to the PLL. The present invention tunes the reference clock frequency to generate the new frequency. In an embodiment, systems and methods of the present invention are also capable of reducing jitter associated with operation of the PLL.

The PLL in the present invention includes a phase detector, a charge pump, a low pass filter, a voltage controlled oscillator ("VCO") and a divider circuit. In an embodiment, the present invention includes a phase rotator placed in the feedback path of the PLL. The phase rotator connects the VCO output to the divider circuit.

The frequency synthesizer implements a coarse output frequency control and a fine output frequency control. In one embodiment, the frequency synthesizer implements coarse frequency control by adjusting a divider ratio of the divider circuit. In another embodiment, the frequency synthesizer implements coarse frequency control by varying input reference signal frequency, received by the phase detector.

The frequency synthesizer implements fine output frequency control by using the phase rotator in the feedback path of the PLL. The phase rotator adjusts the VCO output frequency by constantly rotating phases of the VCO output signal. The speed of rotation of the phase rotator determines whether VCO frequency is adjusted up or down. An accumulator circuit, controlled by a frequency control word (a programmable step), controls the speed of rotation of the phase rotator.

The frequency synthesizer receives a reference signal and generates a plurality of output signals having a plurality of respective phases. The output signals are supplied to the phase rotator in the feedback path of the PLL of the frequency synthesizer. The phase rotator continuously generates more phases from the plurality of received phases. The generated phases are adjacent to one another and are continuously supplied to the output of the phase rotator. The generated phases are rotated at a continuous rate to implement fine frequency tuning, since frequency is a derivative of phase.

The present invention may be implemented in a system, where a variety of equipment is coupled to the frequency synthesizer. Such equipment may have specific requirements to with respect to its driving clock sources.

2. PHASE LOCK LOOP CIRCUIT

FIG. 1 illustrates a conventional phase lock loop ("PLL") 100. Phase lock loop 100 has a phase detector 110, a charge pump 120, a low pass filter 130, a voltage controlled oscillator ("VCO") 140, and a divider 150.

Phase detector 110 is a device that compares the phases of two input signals, generating a phase-error output that is a measure of their difference. More specifically, phase detector 110 receives an input reference signal CLK_REF 101 at a first input terminal 144 and a VCO feedback signal 113 at a second input terminal 145. Phase detector 110 compares the phases of the input reference signal CLK_REF 101 with the VCO feedback signal 113.

Charge pump 120 is coupled to phase detector 110. Charge pump 120 generates an output current 105 representative of the phase difference between input reference signal CLK_REF 101 and VCO feedback signal 113. Low pass filter 130 low-pass filters phase detector output current 105 to remove high frequency noise, and generates an output voltage 107.

Output voltage 107 of low pass filter 130 is the control voltage for VCO 140. VCO 140 receives control voltage 107 and generates a CLK_VCO 109 having a frequency that is determined by control voltage 107. Divider circuit 150 divides the frequencies of VCO output signal CLK_VCO 109 so that it is consistent with the frequency of the input signal CLK_REF 101, generating the VCO feedback signal 113.

3. FREQUENCY SYNTHESIZER CIRCUIT WITH PHASE ROTATOR

Figure 2:
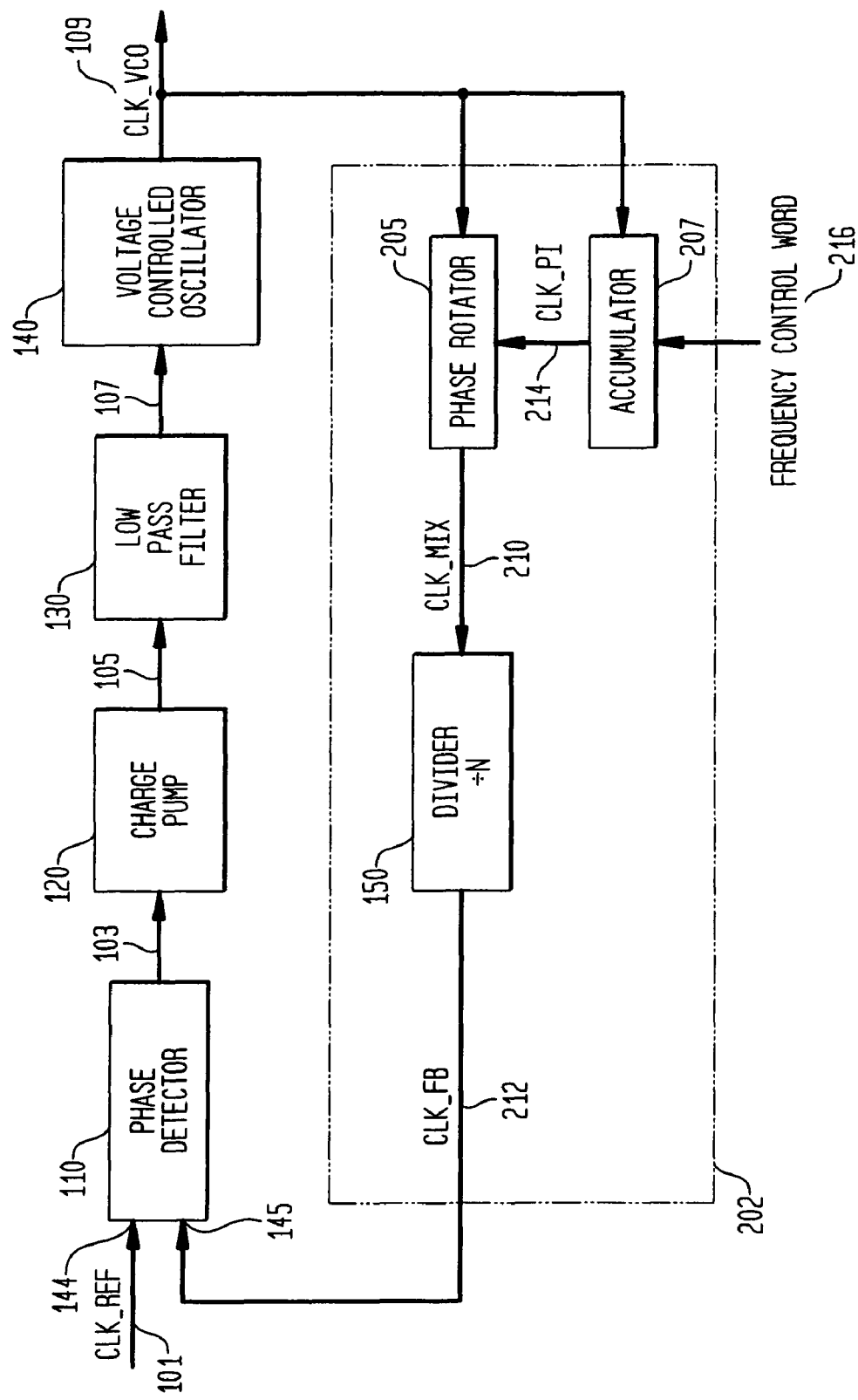
FIG. 2 illustrates a frequency synthesizer circuit according to an embodiment of the present invention.

FIG. 2 illustrates an embodiment of a frequency synthesizer having a phase lock loop 200 with a phase rotator circuit 205, according to embodiments of the present invention. PLL 200 has the phase detector 110, the charge pump 120, the low pass filter 130, the voltage controlled oscillator 140, and a feedback path 202 that has a phase rotator 205 and divider 150.

As discussed above, the phase detector 110 compares the phases of two input signals, generating a phase error output that is a measure of their difference.

Phase detector 110 receives the CLK_REF signal 101 at terminal 144 and a VCO feedback signal CLK_FB 212 from the divider 150 at an input terminal 145. Phase detector 110 compares the phases of input reference signal CLK_REF 101 and VCO feedback signal CLK_FB 212 and generates an error signal 103 that represents their difference. The charge pump 120 generates an output current 105 that represents phase difference between CLK_REF signal 101 and CLK_FB signal 212. Charge pump 120 feeds output current 105 into the low pass filter 130, where the low pass filter 130 filters output current 105 to remove high frequency noise, and generates an output voltage 107. Output voltage 107 is the control voltage for VCO 140. VCO 140 receives output voltage 107 and generates an output signal CLK_VCO 109 having a frequency that is tunable based on the output voltage 107. The output signal CLK_VCO 109 is also the output of the PLL.

The feedback path 202 also receives the CLK_VCO 109 as an input to generate the feedback signal CLK_FB 212 for processing by the phase detector 110. More specifically, the CLK_VCO 109 is the input signal for the phase rotator 205 and an accumulator 207. In an alternative embodiment, CLK_VCO 109 can be substituted with an external clock, which is independent of CLK_VCO 109. The phase rotator 205 continuously rotates the phase of the CLK_VCO 109 at a rotation speed that is determined by the accumulator 207, resulting in a CLK_MIX signal 210. The continuous phase rotation by the phase rotator 205 implements fine frequency tuning, since frequency is the derivative of phase. The phase rotator 205 outputs the CLK_MIX signal 210 to the frequency divider 150. Divider 150 frequency divides CLK_MIX signal 210 to generate CLK_FB signal 212 that has a frequency consistent with the frequency of the CLK_REF 101. Phase detector 110 receives CLK_FB signal 212 at terminal 145 for comparison with the CLK_REF 101.

For the PLL 200 to lock to the reference frequency of CLK_REF 101, the following relationship should hold:

$$f_{CLK\_FB} = f_{CLK\_REF} \quad (1)$$

Therefore, the frequency of CLK_MIX signal 210 should accord to the following relationship:

$$f_{CLK\_MIX} = N * f_{CLK\_REF} \quad (2)$$

Accumulator 207 controls rotation speed of phase rotator 205 based on the frequency of the CLK_VCO 109 and the frequency control word 216.

Frequency control word 216 is a digital signal having bits that represent the desired frequency of the CLK_VCO 109, or a desired increase or decrease in the rotation speed of the phase rotator 205. When accumulator 207 reaches a certain threshold value, it generates a CLK_PI signal 214. CLK_PI signal 214 triggers the phase rotator 205 to either increase or decrease a phase step at which phase rotator 205 is rotating. Speed of rotation of phase rotator 205 is dependent on CLK_PI signal 214. For example, if CLK_PI signal 214 is 1 MHz, then speed of rotation is also 1 MHz. Therefore, CLK_PI signal 214 triggers the phase rotator 205 to perform fine frequency tuning of the CLK_MIX 210 and the CLK_VCO 109. The phase rotator 205 continuously shifts the phase of CLK_VCO 109 to generate the CLK_MIX 210. The continuous phase rotation of the CLK_MIX 210 causes a fine frequency shift in the CLK_MIX 210 (and therefore CLK_FB 212) relative to CLK_VCO 109. The fine frequency shift is ultimately reflected in the frequency of the CLK_VCO 109 by the feedback properties of the PLL. Accordingly, an increase or decrease in the rotation speed of the phase rotator 205 adjusts the frequency shift of the CLK_MIX 210, causing a corresponding frequency shift in the CLK_VCO 109, since frequency is the derivative of its phase. The frequency shift observed in the CLK_VCO 109 may be a fraction of that observed relative to CLK_210 because of the frequency divider 150.

As discussed above, fine frequency tuning of the CLK_VCO 109 is implemented by using the phase rotator 205. Whereas, coarse frequency tuning is implemented using the divider 150. More specifically, coarse frequency tuning can be performed by adjusting the divider ratio of the divider 150. Alternatively, the frequency of the CLK_REF 101 can be adjusted to perform coarse frequency tuning.

Figure 11:
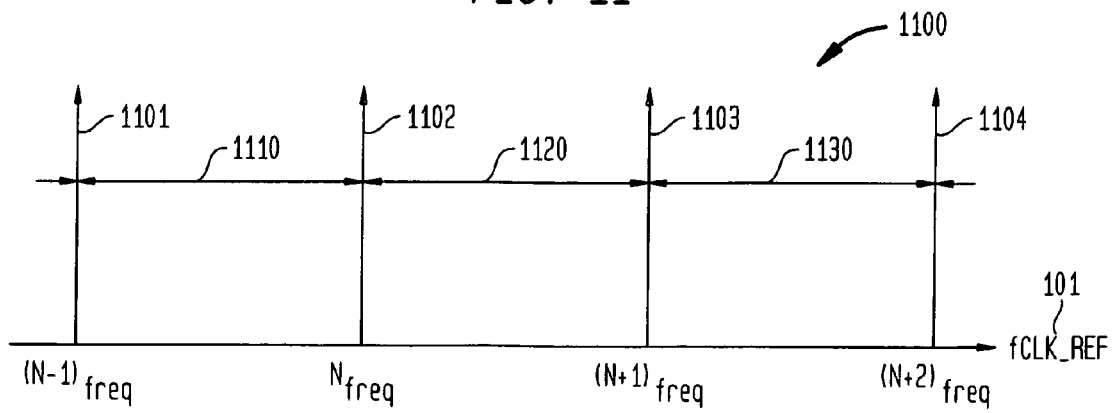
FIG. 11 is a diagram illustrating frequency tuning associated with phase lock loop in the present invention shown in FIG. 2.

FIG. 11 compares coarse and fine tuning of the PLL 200. The horizontal axis represents frequency divisions of input reference frequency of CLK_REF signal 101. The vertical lines 1101-1104 represent coarse frequency tuning limits of PLL 200 that are provided by adjusting either the divider ratio of the divider 150 or the CLK_REF 101. For example, vertical line 1101 represents the following coarse tuning range $f_{CLK\_MIX} = (N-1)*f_{CLK\_REF}$; vertical line 1102 represents: $f_{CLK\_MIX} = N*f_{CLK\_REF}$; vertical line 1103 represents: $f_{CLK\_MIX} = (N+1)*f_{CLK\_REF}$; and so on, where N represents the divider ratio.

Frequency intervals 1110 through 1130 are set between the coarse frequency tuning limits 1101 through 1104, and represent the fine tuning ranges provided by the phase rotator 205. Therefore, within frequency intervals 1110 through 1130, phase rotator 205 is capable of fine tuning frequency of CLK_MIX signal 210, and therefore the CLK_VCO 109.

In an embodiment, accumulator 207 is a digital device including an L-bit counter and an L-bit adder. L is defined as a count threshold value. Therefore, once CLK_VCO signal 109 or an external clock triggers the accumulator, the accumulator's L-bit counter value will be added by a programmed value (in this case it is FCW signal 216). Upon achieving the count threshold value, accumulator 207 generates CLK_PI signal 214. CLK_PI signal 214 triggers phase rotator 205 to either increase or decrease the phase step indicative of the speed of rotation of phase rotator 205. Thus, the frequency of the CLK_PI signal 214 is calculated based on frequencies of CLK_VCO signal 109 (or an external clock independent of CLK_VCO signal 109) and FCW signal 216:

$$f_{CLK\_PI} = f_{VCO} * \frac{FCW}{2^L} \quad (3)$$

where CLK_VCO signal 109 can be substituted with an external clock independent of CLK_VCO signal 109.

Figure 4:
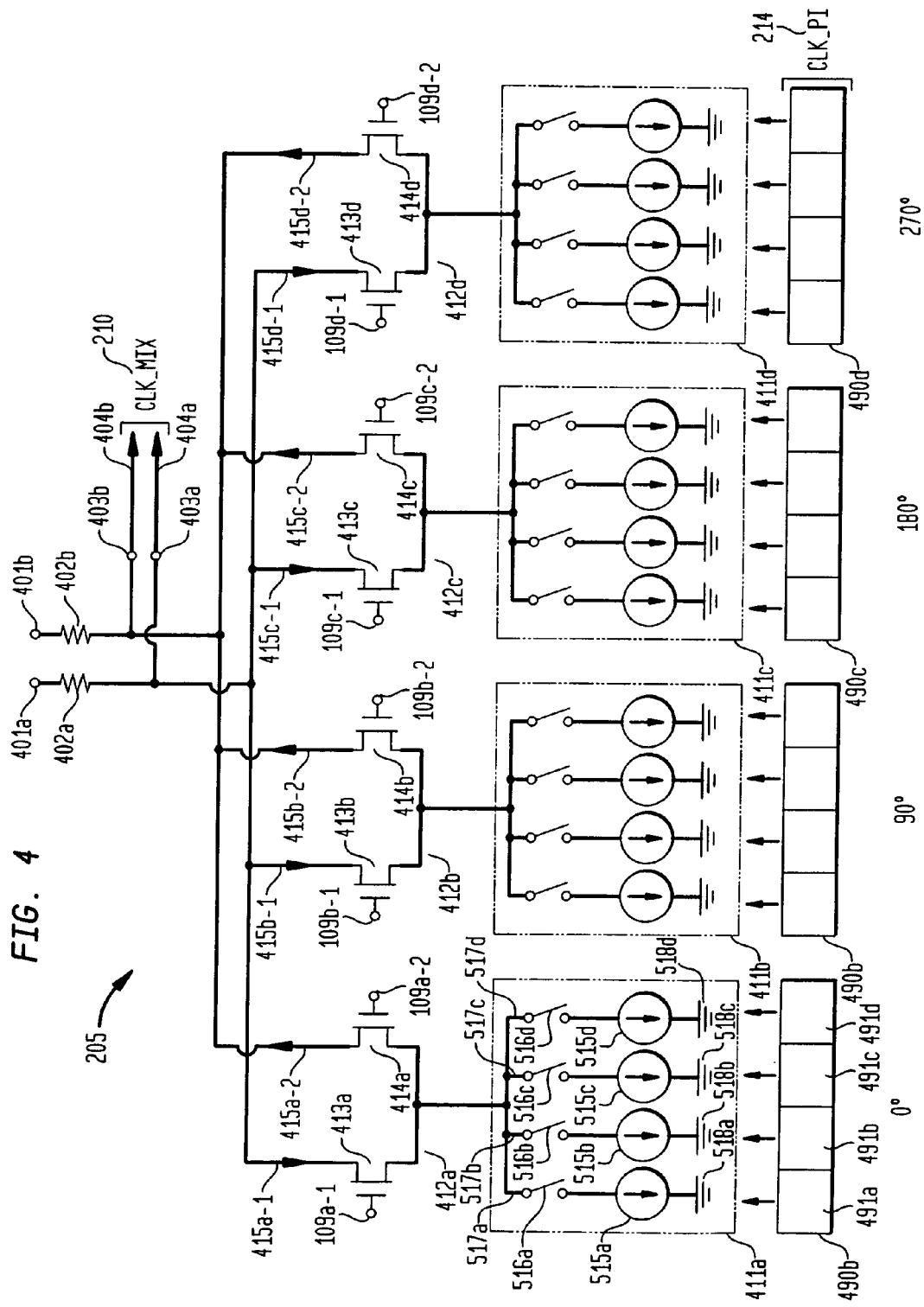
FIG. 4 illustrates a 4-bit phase rotator according to embodiments of the present invention.
Figure 5:
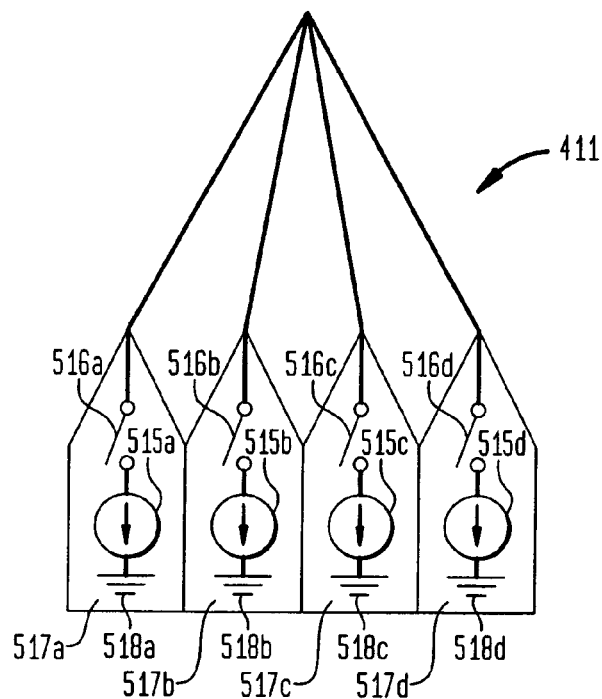
FIG. 5 is a block diagram of an embodiment of a digital-to-analog converter shown in FIG. 4.

FIG. 4 illustrates an example embodiment of a phase rotator 205. Phase rotator 205 includes a plurality of differential amplifiers 412(a, b, c, d) coupled to groups of digital-to-analog converters ("DAC") 411(a, b, c, d) that are controlled by a shift register 490(a, b, c, d). The differential amplifiers 412, DACs 411, and shift registers 490 are configured in 4 groups to represent the 4 primary phases around the unit circle, namely 0, 90, 180, and 270 degrees. In FIG. 4, each DAC group 411 comprises of four digital-to-analog converters 517(a, b, c, d). However, the number of DACs 517 in each group 411 can vary with the number of bits in the rotator. FIG. 5 further illustrates a DAC group 411 having four individual DACs 517, where each DAC 517 includes a switch 516 and a current source 515.

Differential amplifiers 412 are coupled with corresponding DAC groups 411, where the DAC group 411 provides bias current for the corresponding differential amplifier 412. Each differential amplifier 412 comprises a pair of MOS devices 413(a, b, c, d) and 414(a, b, c, d), respectively, so as to provide a differential output 403a and 403b. The MOS devices 413(a, b, c, d) and 414(a, b, c, d) are controlled by CLK_VCO 109 supplied by the phase locked loop circuit 200 of the present invention. For example, the PLL CLK_VCO 109 are applied to the respective gates of the MOS devices 413 and 414. In an embodiment, the PLL has four differential delay cells (corresponding to four differential amplifiers 412) generating four differential signals having eight phases. In FIG. 4, for example, the CLK_VCO 109a is applied to the differential amplifier 412a, CLK_VCO 109b is applied to the differential amplifier 412b, and so on. (It is noted that the "−1" and "−2" in the FIG. 4 represent the positive and negative components of the differential signal).

CLK_VCO 109a, 109b, 109c, and 109d have different phase shifts because they are tapped from different points of the output of the VCO 140 to produce the different phases. These differential signals are weighted and combined by the differential amplifiers 412 to produce CLK_MIX signal 210.

The relative weighting of the CLK_VCO 109a, 109b, 109c, and 109d is determined by the activation of the corresponding DACs 411 as discussed further below.

The PLL CLK_VCO 109 modulates the differential amplifiers 412, in accordance with the current supplied by the active DACs 517 in each respective DAC group 411, to produce weighted output signals 415(a, b, c, d). The output signals 415 are weighted relative to each other based on the DAC 517 that are active, as will be described further below.

The weighted output signals 415(a, b, c, d) are combined at the output terminals 403(a, b) to produce a differential output signal 404(a, b) that is CLK_MIX 210. The differential output signal 404 represents a phase state of the 360 degree cycle, as determined by relative weighting of the weighted output signals 415(a, b, c, d).

The DAC 517 is controlled using digital bits (i.e., binary sequences of 0's or 1's forming a digital word). If a digital bit, controlling a DAC 517 is a value of 1, then a current is applied to the DAC 517. If the digital bit, controlling a DAC 517 is a value of 0, then a current is not applied to the DAC 517. Since, there are only two values in a digital bit that control application of current to each DAC 517 and a 4-bit word is supplied to the rotator, then a sequence of sixteen 0's or 1's represents the 4-bit digital word that controls the phase rotator.

Each DAC 517(a, b, c, d) is represented by a switch 516(a, b, c, d) and a respective current source 515(a, b, c, d). Each switch 516 is controlled by a corresponding bit in a switch register 490, having individual register outputs 491. The register outputs 491 are grouped together in groups 490a through 490d, to correspond with the DAC groups 411. Each group 490(a, b, c, d) corresponds to a particular clock phase source of 0°, 90°, 180°, 270°. When a register output 491 is a "1", then the corresponding switch 516 is closed, and current is supplied to the DAC 517. When a register output 491 is a "0", then the corresponding switch 516 is closed, and current is not supplied to the corresponding DAC 517. The result is that the CLK_VCO signal 109 are weighted by the corresponding DACs 517 to produce weighted output signals 415(a, b, c, d). The weighted output signals 415(a, b, c, d) represent the clock phase sources (0°, 90°, 180°, 270°), weighted by the corresponding DACs 517. The weighted output signals 415 are combined at the differential output terminals 403 to produce the differential output signal CLK_MIX 210 (as was described). The differential output signal 404 represents one of the phase states of the 360 degree cycle.

The switch register 490 incrementally shifts a group of "1"s through the output ports 491, where the number of "1"s in a group is $2^n/4$ (n representing number of bits in the phase rotator). As a result, the relative weighting of the weighted output signals 415(a, b, c, d) continuously changes over time. The differential output signal 404 represents one of the phase states of the 360 degree cycle, and can be seen to rotate around the 360 degree cycle as discussed further below.

CLK_PI signal 214 from the accumulator 207 continuously activates digital-to-analog converters within DAC groups 411(a, b, c, d). This causes the CLK_VCO signals 109(a, b, c, d) to have different weight assigned to them over time, and thereby causes the phase rotation of differential outputs 404 that is the CLK_MIX signal 210. CLK_MIX signal 210 has a phase that continuously rotates according to the frequency of CLK_PI signal 214, because the speed of the shifting bits determines the phase rotation speed of the weighted output signal at terminals 403(a, b). The CLK_PI signal 214 is an input clock for the phase rotator 205, and an increase or decrease in the frequency of CLK_214 increases or decreases the phase rotation of the CLK_MIX 210 and also shifts the frequency of CLK_MIX 210. The CLK_VCO 109 is also fine-tuned through the operation of the PLL 200 as well. Therefore, frequency of CLK_VCO signal 109 can be calculated as follows:

$$f_{CLK\_VCO} = N * f_{CLK\_REF} \pm \frac{f_{CLK\_PI}}{2^M} \quad (4)$$

where M is the number of bits in the digital-to-analog converter in DAC groups 411(a, b, c, d). It is noted, that any digital quantization noise caused by the increase or decrease in the phase step of the phase rotator 205 is mitigated by digital-to-analog converters within DAC groups 411 (a, b, c, d), because $f_{CLK\_VCO}$ is divided by $2^M$. Furthermore, adjusting the loop bandwidth of the PLL 200, so that the noise falls out of the loop bandwidth of the PLL 200, reduces this quantization noise. Also, the quantization noise is attenuated by adjusting the number of bits in the accumulator 207. This is because of:

$$f_{CLK\_PI} = \frac{FCW}{2^L} * f_{CLK\_VCO} \quad (5)$$

where L is the number of bits associated with the accumulator 207. Therefore, the frequency of CLK_VCO signal 109 can be rewritten, by combining equations (4) and (5) as follows:

$$f_{CLK\_VCO} = N * f_{CLK\_REF} \pm \frac{FCW}{2^{L+M}} * f_{CLK\_VCO} \quad (6)$$

where CLK_VCO signal 109 can be an external clock independent of CLK_VCO signal 109.

Any quantization noise associated with CLK_PI signal 214 is reduced by both the bit size of the digital-to-analog converter within DAC groups 411(a, b, c, d) in phase rotator 205 and bit size of the accumulator 207. Furthermore, because of the PLL architecture, any high frequency noise is attenuated by low pass filtering in the PLL loop. The low frequency noise is reduced as well because of the smaller phase step in the phase rotator 205 placed in the feedback loop of the PLL 200.

Therefore, as can be seen from equations (4)-(6), controlling frequency of CLK_PI signal 214 achieves control over frequency of CLK_MIX signal 210. FCW signal 216 and accumulator 207 control how fast phase rotator 205 rotates phases of CLK_VCO 109. This, in turn, changes frequency of CLK_VCO signal 109, because frequency is a derivative of phase. Thus, frequency of CLK_MIX signal 210 is closer to $N*f_{CLK\_REF}$. Therefore, the frequency of CLK_FB signal 212, which phase detector 110 receives at terminal 145, is closer to CLK_REF signal 101 frequency.

The frequency synthesizer of the present invention having this PLL architecture generates very low phase jitter. This architecture also improves frequency resolution. In an embodiment, the frequency resolution can be 300 Hz steps and tuned over a band of 50 MHz to 500 Mhz. In another embodiment, the PLL loop bandwidth can be set to attenuate any high frequency noise, as well. Finally, this PLL architecture reduces circuit size.

The phase rotator 205 is further described below and in U.S. patent application Ser. No. 10/131,033 to Chen, titled "Low Jitter Phase Rotator", filed Apr. 25, 2002, which is incorporated herein by reference in its entirety. The phase rotator 205 in FIG. 4 is illustrated as a 4-bit phase rotator having a 16-bit output. However, other embodiments of phase rotator 205 having a different number of bits are possible.

4. PHASE ROTATOR

As discussed above, the phase rotator (also called a "phase interpolator") generates more phases out of the phases received from the VCO 140, and the phases are continuously rotated (in time) to implemented a frequency shift in the signal CLK_MIX 214. The phases are rotated in an incremental manner, where the difference between two phase states is referred to as jitter, and generally should be reduced.

A rotator consists of a plurality of digital-to-analog converters (DACs) coupled together into a group according to clock phase sources of 0°, 90°, 180°, and 270°. The phase rotator operates in a full phase cycle of 360°. As would be understood by one having ordinary skill in the art, other clock phase sources are possible.

Figure 6:
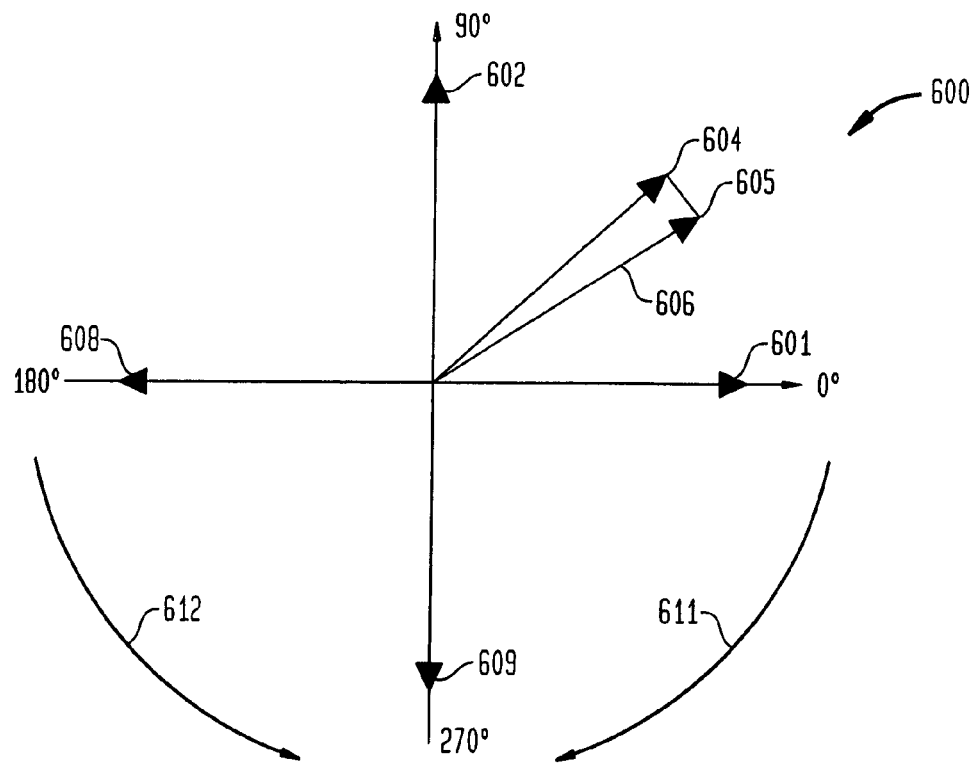
FIG. 6 is a diagram of a full phase cycle showing particular phases.

Referring to FIG. 6, a full phase cycle 600 of 360° is shown to have a first clock phase source 601 at 0°, a second clock phase source 602 at 90°, a third clock phase source 608 at 180°, and a fourth clock phase source 609 at 270°. Each clock phase source represents one quarter of the full phase cycle 600. The clock phase is defined by a relationship where the frequency of a continuously rotated signal is a derivative of the clock phase.

The number of DACs determines the phase jitter in the system. The smaller the number of DACs, the greater the phase jitter or noise, the greater the number of DACs the smaller the jitter. This occurs because the number of DAC also determines the number of phase states that exist in the 360 degree rotation cycle. The greater the number of DACs, the greater the number of phase states. The phase jitter must be significantly reduced without increasing circuit space and power to operate the circuit.

Referring to FIG. 6, phase jitter is represented as a gap that is formed between two adjacent phases generated by the phase rotator. For example, if phases represented by arrows 604 and 605 were adjacent phases, the gap 606 formed between two phases would represent jitter in the system. The larger the gap, the greater the jitter. Conversely, the smaller the gap, the smaller the jitter.

Each DAC group is controlled by a differential signal supplied to the group. The differential signal may come from a phase locked loop circuit coupled with the phase rotator. The PLL may have a plurality of delay cells that may be paired up to generate a plurality of differential signals to be supplied to the phase rotator.

A DAC comprises a switch and a current source. Whenever the digital value of a DAC is 1, the switch is closed and a current is applied to the DAC. When the digital value of the DAC is 0, the switch is open and no current is applied to the DAC. Therefore, any data signals sent to the system will generate current and when this current is applied to the DAC it is represented by a sequence of 0's and 1's in a digital form. Thus, if an n-bit word is received, it is represented by a sequence of 0's and 1's.

Since the decoded digital word is represented by a binary number (0's or 1's), then the entire length of the decoded digital word may be represented by $2^n$, where n is an integer. The integer n is a number of characters in a digital word (i.e., 4-bit, 6-bit, etc.) that are decoded by the rotator's decoder. Therefore, in a 4-bit phase rotator, n equals to 4 and the length of the digital word is 16. In a 6-bit phase rotator, n is 6 and the length of the digital word is 64.

The number of characters that need to be decoded determines how many bits in the decoded digital word would be 1 and how many would be 0. Therefore, in a 4-bit rotator, in the decoded digital word of length 16, there are 4 ones and 12 zeros. Similarly, using the 6-bit rotator, 16 ones and 48 zeros are generated. Each 1 in the decoded digital word corresponds to a DAC being turned on. This means that the switch located in that DAC is closed and the current is supplied to the DAC. Each 0 in the decoded digital word corresponds to a DAC being turned off. This means that the switch located in that DAC is open and no current is supplied to it.

Each decoded digital word represents a particular phase state of the 360 degree phase cycle that is shown in FIG. 6. An output phase is determined by computing the mean of phases defined by adjacent clock phase sources (i.e., 0°, 90°, 180°, or 270°). Therefore, if there are two phases from two adjacent clock phase sources (e.g., 0° and 90°), then the output phase would equal to the mean of the two phases. The following formula represents how the new output phase $\phi_0$ is computed using the two phases $\phi_a$ and $\phi_b$ from two adjacent clock phase sources:

$$\cos(2\pi ft + \varphi_0) = \frac{k}{N}\cos(2\pi ft + \varphi_a) + \frac{(N-k)}{N}\cos(2\pi ft + \varphi_b) \quad (7)$$

where k corresponds to the number of DACs that have value 1 in a particular clock phase source (i.e., 0°, 90°, 180°, or 270°), N corresponds to the total number of bits in the DAC (i.e., in a case of 6-bit rotator, there are 8 bits per each clock phase source), f and t correspond to frequency and time, respectively.

In the rotator, the output phase is determined by how many DACs have a value of 1, i.e., a current is supplied to the DAC. For instance, in a 4-bit rotator, if first four DACs (out of 16) have a value of 1, then the output phase is determined by the following $$\frac{4}{4}*(0°) + \frac{0}{4}*(90°) + \frac{0}{4}*(180°) + \frac{0}{4}*(270°) = 0° \quad (8)$$

Therefore, the output phase is 0°. In a second example, the first DAC has a value of 0, and the following four DACs have a value equal to 1. Therefore, the output phase is computed as follows:

$$\text{Output phase} = \frac{3}{4}*(0°) + \frac{1}{4}*(90°) + \frac{0}{4}*(180°) + \frac{0}{4}*(270°) = 22.5° \quad (9)$$

Therefore, the output phase is 22.5°. The output phase depends on how the current is supplied to each digital-to-analog converter within each clock phase source (0°, 90°, 180°, 270°). Current supply to the DAC corresponds to the value of 1 assigned to the DAC and in the calculation of the output phase counts towards determination of the fraction's numerator of each clock phase source contribution. Referring to the second example above, 3 DACs have a current supplied to them at clock phase source of 0°, and 1 DAC has a current supplied to it at clock phase source of 90°, to produce 22.5° output phase.

Therefore, by decoding information located in the n-bit word supplied to the rotator, the rotator is capable of producing a $2^n$ sequence of 0's and 1's, where there are n ones and ($2^n$-n) zeros. Therefore, since there are $2^n$ combination representing different decoded digital words are possible. Then, the number of phases is $2^n$.

Once the rotator decodes an n-bit digital word into a decoded digital word, the rotator will shift the output phase depending on how the new phases are supplied at each clock phase source. Such shift is performed in a continuous manner. This is accomplished by changing the assigned value of the DACs from 0 to 1 or from 1 to 0. In order to change the value assigned to the DAC, a switch located within each DAC must either be opened or closed. Closed switch means that there is current suppled to the DAC and DAC assumes value of 1 and open switch means that there no current suppled to the DAC and DAC assumes value of 0. By switching DACs on and off, it is possible to achieve a shift in the phase, as indicated in the table in FIG. 7. When there is a shift in the phase, the output phase changes, since the number of 1's and 0's corresponding to a particular DAC changes within each clock phase source.

When input phases shift, depending on whether the rotator is 4-bit or 6-bit or other, there is a gap formed between the output phases. For instance, using the 4-bit rotator, the phase represented by the digital word of 0111100000000000 is 22.5° and the phase represented by the digital word of 0011110000000000 is 45°. Therefore, there is a gap between the above phases of 22.5°. When fine tuning is required, such gap creates jitter in the system, causing distortion in the signal supplied to the output of the system and making it difficult to operate various components coupled to the system. The jitter can be reduced by using a 6-bit rotator, where 8 DACs, at any given time, have value of 1. However, there is still a gap of about 11.25°. This also creates jitter in the system. Furthermore, a 6-bit rotator requires more area and power than a 4-bit rotator.

It is desirable to reduce the jitter and create a greater number of output phases without increasing the phase rotator size or increasing the power requirements needed to operate the phase rotator. In an embodiment, a 6-bit rotator may be used, however, other types of rotators may be used. A 6-bit rotator would generate 64 output phases, out of which a desired phase may be selected. Nonetheless, the gap between two adjacent output phases may be on the order of 11.25°, as described above.

FIG. 7 illustrates sixteen phases of the 4-bit phase rotator that is shown in FIG. 4. The table by means of which these phases are shown is represented as follows: the rows or "levels" represent particular phase states at a point in time and the columns describe a value (either 0 or 1) assigned to each digital-to-analog converter 517 in the phase rotator by the corresponding shift register output 491. Each level represents a particular phase state around the 360 degree cycle. The next phase is the previous phase shifted. For a 4-bit rotator, there are four DACs 517 assigned to each phase clock source (0°, 90°, 180°, 270°). Thus, first four columns in FIG. 7 represent the first phase clock source (0°), the next four columns represent the second phase clock source (90°) and so on. The output phase is calculated, as is described above, by taking a mean of each of the phase clock sources' corresponding values.

Still referring to FIG. 7, the first phase corresponding to 0° is shown at level 0 and is represented by the following sequence: 1111000000000000. The next phase is represented by 0111100000000000 at level 1. The level 1 phase is the level 0 shifted by one bit. The phase at level 1 corresponds to 22.5°. All of the sixteen phases generated by the 4-bit phase rotator are shown in sequence. The sequence 1111000000000000 can represent a decoded 4-bit digital word that corresponds to a first digital word before the rotator shifts the phase by some degree, as shown in row 0, FIG. 7. When the 4-bit rotator shifts a phase, the next decoded digital word is represented by the following sequence: 0111100000000000 (FIG. 7, row 1).

Figure 3:
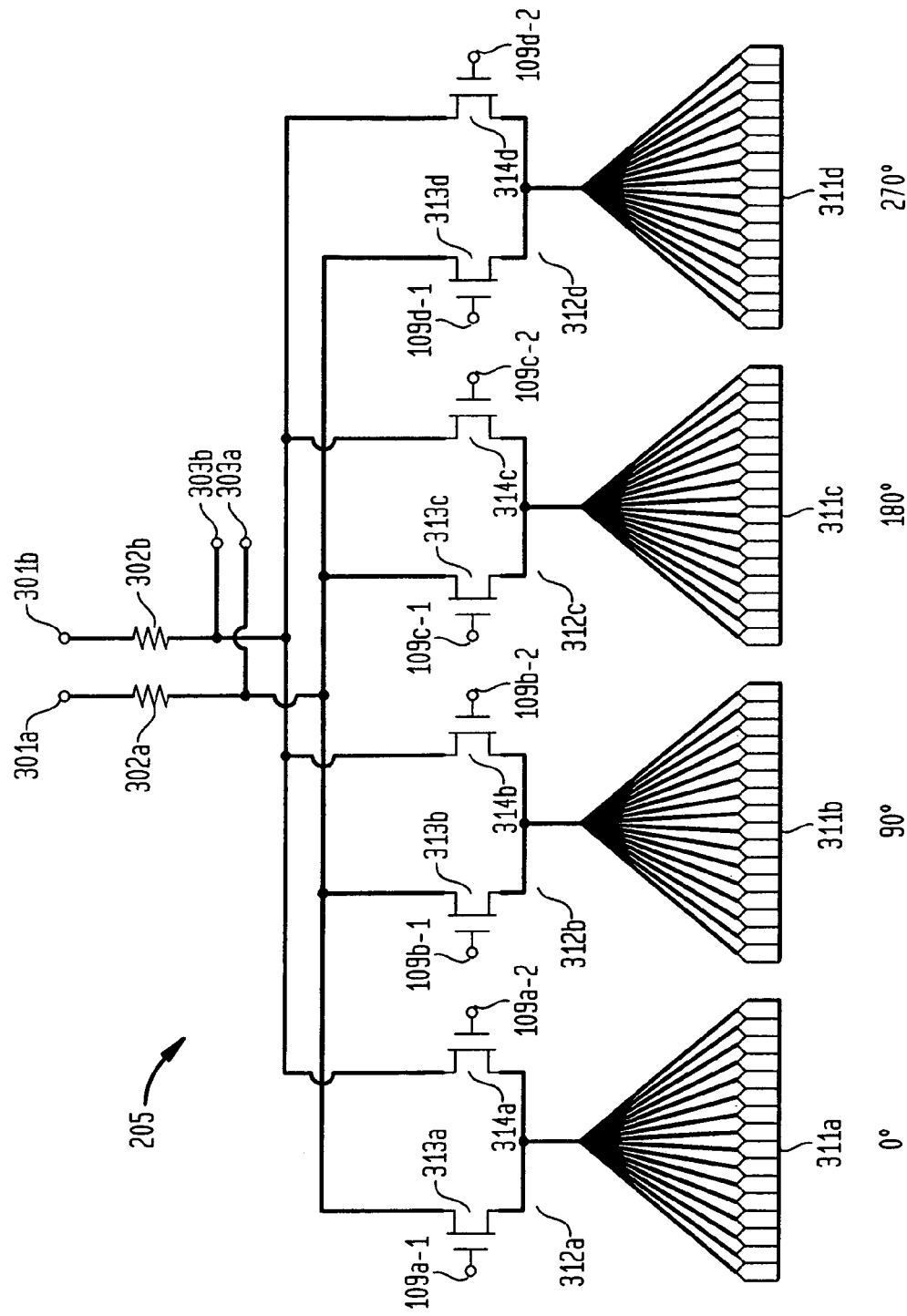
FIG. 3 illustrates a block diagram of a 6-bit phase rotator according to the present invention.

A 6-bit phase rotator can generate 64 phases, and includes 64 DACs 517 that are grouped accordingly to each adjacent clock phase sources of 0°, 90°, 180°, or 270°. Each group 311 of DACs 517 has sixteen DACs 517 as shown in FIG. 3. A 6-bit digital word is decoded into a sequence of 0's and 1's that is 64 characters long. At any given time, there are sixteen corresponding DACs that have a value of 1 (meaning the current is supplied to the DAC) and the rest of the DACs have a value of 0 (meaning the current is not supplied to the DAC). The 6-bit phase rotator operates similar to the 4-bit rotator but has more bits and more phase states.

Referring to back to FIG. 6, two adjacent phases generated by the 6-bit phase rotator are shown. A phase 604 represents a 45° phase generated by a 6-bit rotator. Phase 605 represents a 33.75° phase, where phase 605 is an adjacent phase to the phase 604. A gap 606 of 11.25° is formed between phases 604 and 605. The gap 606 represents the jitter in the system, when the 6-bit rotator is used to generate and shift phases.

5. LOW JITTER PHASE ROTATOR

In one embodiment, the rotator is implemented to minimize the jitter in the system. More specifically, when the 6-bit rotator shifts from one phase to another (i.e., switching off the first DAC, having the value of 1, and switching on the DAC, having value 0 and following the last DAC having value 1), the current is still suppled to the original first DAC having the value of 1. Therefore, during the next phase, the digital word has nine DACs that have a value of 1. In the next phase shift, only the first DAC is switched off, thereby assuming the value of 0. The phase shift, therefore, proceeds in two stages, thus, generating two separate phases. This procedure is repeated to transition to the other phase states.

In effect, the 6-bit rotator becomes a 7-bit rotator without increasing the circuit size or increasing the power to operate the DAC. The number of output phases generated becomes 128, which is a double of the original 64 output phases that is achieved with a 6-bit rotator. This can narrow the difference between two adjacent phases down to 2.5°, which reduces the jitter in the system. In an embodiment, the above techniques reduces the jitter in the system by 6 dB.

FIG. 8 further illustrates the jitter reduction for a 4-bit phase rotator.

Referring to level k, the phase represented by sequence of 0000001111000000 is shown corresponding to 135°. The phase, shown at level k+1, represented by sequence 0000001111100000 corresponds to 144°. The phase, shown at level k+2, represented by 0000000111100000 corresponds to 157.5°. In the conventional 4-bit phase rotator, the phases at level k and k+2 are adjacent phases, and the difference between these two phases would be 22.5°. Whereas, in the present invention, the difference between adjacent phases is narrowed between adjacent phases. Phases at levels k and k+2 are no longer adjacent phases. Phases at levels k and k+1 are adjacent phases and phases at levels k+1 and k+2 are adjacent phases. The phase difference between phases at levels k and k+1 is 9° and the phase difference between phases at levels k+1 and k+2 is 13.5°. Since, the phase difference between the adjacent phases is smaller than in the convention system, the amount of jitter is reduced.

Figure 9:
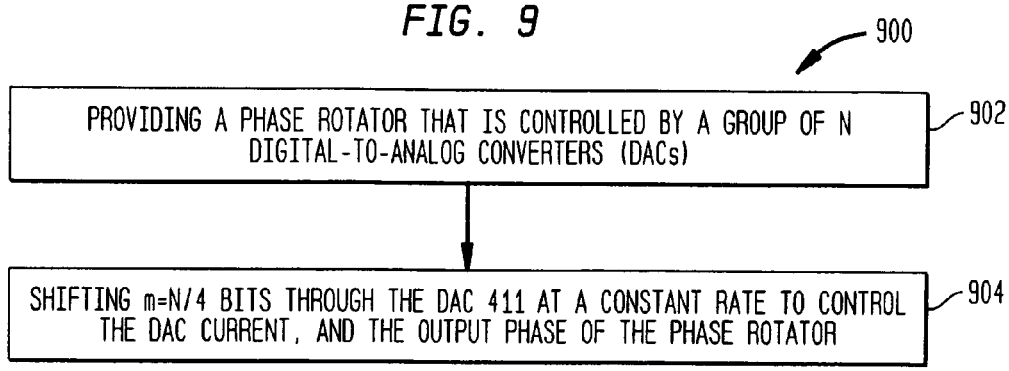
FIG. 9 is a flowchart diagram of the method of operation of the phase rotator in the present invention.
Figure 10:
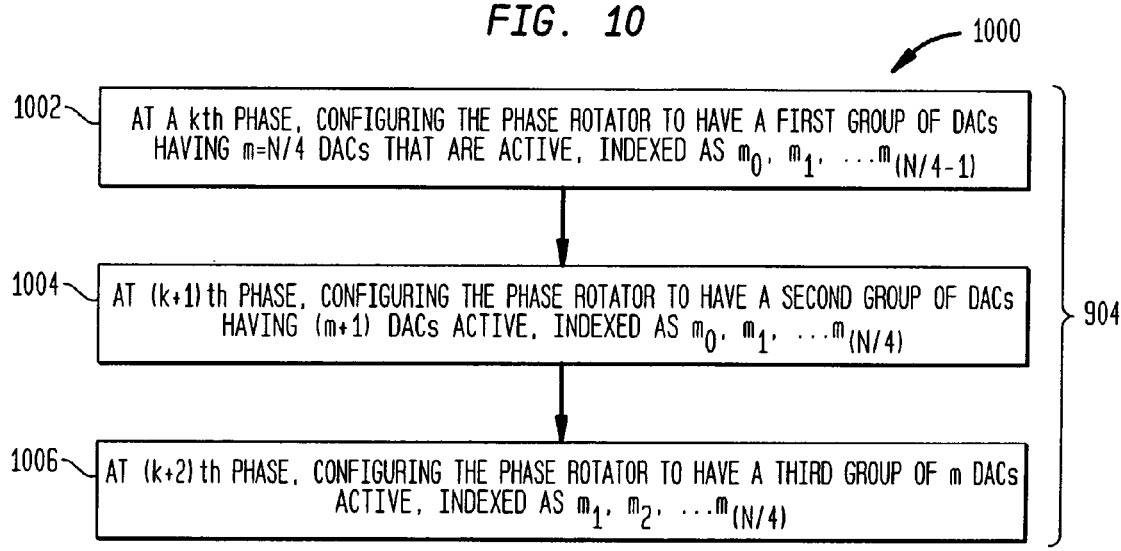
FIG. 10 is a more detailed representation of a FIG. 9 method step of shifting bits in the phase rotator.

The operation of the low jitter phase rotator as described by the 4-bit example in FIG. 8 can be generalized as follows for an n-bit phase rotator made up of a $N=2^n$-number of digital-to-analog converters (DAC). The generalized discussion is further described by flowchart 900 in FIG. 9.

At step 902, a phase rotator is provided that is controlled by a group of $N=2^n$ digital-to-analog converters (DACs). For example, the phase rotator 205 in FIG. 4 includes a N-bit DAC 411 that controls the phase rotator, where N is 16 in FIG. 4.

At step 904, m=N/4 bits are shifted through the DAC 411 at a constant rate to control the DAC current, and the output phase of the phase rotator. For example, FIG. 8 illustrates shifting bits through the DAC to control the output phase of the phase rotator.

The step 904 in the flowchart 900 can be further described by the flowchart 1000.

At a $k^{th}$ phase in step 1002, the phase rotator is configured to have a first group of DACs having m=N/4 DACs that are active, indexed as $m_0, m_1, \ldots m_{(N/4-1)}$. For example, referring to FIG. 8 at level k, the DACs #7-10 are active, where DAC #7 represents $m_0$, and DAC #8 represents $m_1$, DAC #9 represents $m_2$, and DAC #10 represents $m_3$.

At $(k+1)^{th}$ phase at step 1004, the phase rotator is configured to have a second group of DACs having (m+1) DACs active, indexed as $m_0, m_1, \ldots m_{(N/4)}$. For example, referring to FIG. 8, the DACs 7-11 are active, where DAC #11 represents $m_4$.

At $(k+2)^{th}$ phase at step 1006, the phase rotator is configured to have a third group of m DACs active, indexed as $m_1, m_2, \ldots m_{(N/4)}$. For example, referring to FIG. 8, the DACs 8-11 are active.

The steps in flowchart 1000 are continuously repeated for all the phase states around the 360 degree phase cycle. It is noted that the $m_0^{th}$ DAC is left active at the $(k+1)^{th}$ phase, and is not deactivated until the $(k+2)^{th}$. The result is that there is one more active DAC at the $(k+1)^{th}$ phase than at the $k^{th}$ phase or the $(k+2)^{th}$ phase. Therefore, the gaps between the $k^{th}$, $(k+1)^{th}$, and $(k+2)^{th}$ phase states are reduced, thereby reducing the phase jitter of the phase rotator.

It is understood by one skilled in the art that the low jitter phase rotator is not limited to having four clock phase sources. In another embodiment, the phase rotator may be provided that is controlled by a group of N digital-to-analog converters (DACs), where N is a positive integer. For example, the phase rotator 205 in FIG. 4 includes N-bit DAC 411 that control the phase rotator, where M<N. At any given time, m=M bits are shifted through the DAC 411 at a constant rate to control the DAC current, and the output phase of the phase rotator.

At a $k^{th}$ phase, the phase rotator is configured to have a first group of DACs having m=M DACs that are active, indexed as $m_0, m_1, \ldots m_{(M-1)}$.

A $(k+1)^{th}$ phase, the phase rotator is configured to have a second group of DACs having m=M+1 DACs active, indexed as $m_0, m_1, \ldots m_{(M)}$.

At $(k+2)^{th}$ phase, the phase rotator is configured to have a third group of m DACs active, indexed as $m_1, m_2, \ldots m_{(M)}$.

The above steps are continuously repeated for all the phase states around the 360 degree phase cycle. It is noted that the $m_0^{th}$ DAC is left active at the $(k+1)^{th}$ phase, and is not deactivated until the $(k+2)^{th}$. The result is that there is one more active DAC at the (k+1) phase than at the $k^{th}$ phase or the $(k+2)^{th}$ phase. Therefore, the gaps between the $k^{th}$, $(k+1)^{th}$, and $(k+2)^{th}$ phase states are reduced, thereby reducing the phase jitter of the phase rotator.

6. CONCLUSION

Example embodiments of the methods, circuits, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A frequency synthesizer, comprising:

a phase lock loop (PLL) having a plurality of output taps configured to generate an oscillator output signal having a plurality of output phases responsive to a feedback input, wherein said phase lock loop includes a feedback path coupled between an output of said PLL and said feedback input, wherein said feedback path includes a means for rotating a phase of said oscillator output signal in said feedback path to tune a frequency of said oscillator output signal, wherein said means for rotating includes, a plurality of differential amplifiers configured to receive said plurality of output phases;

a differential output configured to combine respective outputs of said differential amplifiers; and means for weighting said plurality of output phases over time responsive to an input clock, wherein said means for weighting includes a plurality of digital-to-analog converters (DACs) arranged in groups, each group of DACs configured to supply bias current to a corresponding differential amplifier; and a shift register configured to receive said input clock and having a plurality of outputs configured to switch said plurality of digital-to-analog converters (DACs) responsive to said input clock.

2. The frequency synthesizer of claim 1, wherein a frequency of said input clock determines a switching speed of said DACs, and thereby a rotation speed of a phase of said differential output.

3. The frequency synthesizer of claim 1, wherein each of said DACs includes a current source that is series-connected with a switch, said switch controlled by a respective output of said shift register.

4. The frequency synthesizer of claim 1, wherein said frequency of said oscillator output signal is determined according to the following equation:

$$f_{CLK-VCO} = N * f_{CLK-REF} \pm \frac{f_{CLK-PI}}{2^M}$$

wherein, fCLK_REF is a frequency of a reference clock received by said PLL;

fCLK_PI is said frequency of said input clock; and

M is a number of bits in said digital-to-analog converters in said DAC groups; and N represents a divider ratio of said feedback path.

5. A frequency synthesizer, comprising:

a phase lock loop (PLL) configured to generate an oscillator output signal having a plurality of output phases responsive to a feedback input;

wherein said PLL includes a feedback path coupled between an output of said PLL and said feedback input, wherein said feedback path includes a phase rotator configured to tune a frequency of said oscillator output signal based on a rotation speed of said phase rotator; and wherein said phase rotator includes
a plurality of differential amplifiers configured to receive said plurality of output phases;
a differential output configured to combine respective outputs of said differential amplifiers;
a plurality of digital-to-analog converters (DACs) arranged in groups, each group of DACs configured to supply bias current to a corresponding differential amplifier; and
a shift register configured to receive an input clock and having a plurality of outputs configured to switch said plurality of digital-to-analog converters (DACs) responsive to said input clock.

6. The frequency synthesizer of claim 5, wherein said feedback path includes a frequency divider in the feedback path configured to perform additional frequency tuning of said frequency of said oscillator output signal.

* * * * *